United States Patent
Kim et al.

(10) Patent No.: US 8,323,529 B2
(45) Date of Patent: *Dec. 4, 2012

(54) FLUORESCENT MATERIAL AND LIGHT EMITTING DIODE USING THE SAME

(75) Inventors: Kyung Nam Kim, Ansan (KR); Sang Mi Park, Ansan (KR); Tomizo Matsuoka, Ansan (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 651 days.

This patent is subject to a terminal disclaimer.

(21) Appl. No.: 12/293,160

(22) PCT Filed: Mar. 16, 2006

(86) PCT No.: PCT/KR2006/000961
§ 371 (c)(1),
(2), (4) Date: Sep. 16, 2008

(87) PCT Pub. No.: WO2007/105845
PCT Pub. Date: Sep. 20, 2007

(65) Prior Publication Data
US 2009/0096350 A1    Apr. 16, 2009

(51) Int. Cl.
*C09K 11/08* (2006.01)
*C09K 11/56* (2006.01)
(52) U.S. Cl. .................................. 252/301.4 S
(58) Field of Classification Search ............ 252/301.4 S, 252/301.4 R; 313/503, 467, 468; 428/690
See application file for complete search history.

(56) References Cited

U.S. PATENT DOCUMENTS

| | | | |
|---|---|---|---|
| 2,110,162 A | 3/1938 | Leverenz | |
| 2,402,760 A | 6/1946 | Leverenz | |
| 3,639,254 A * | 2/1972 | Peters | ........ 252/301.4 S |
| 4,065,688 A | 12/1977 | Thornton | |
| 4,303,913 A | 12/1981 | Tohda et al. | |
| 4,563,297 A | 1/1986 | Kukimoto et al. | |
| 5,208,462 A | 5/1993 | O'Connor | |
| 5,598,059 A | 1/1997 | Sun | |

(Continued)

FOREIGN PATENT DOCUMENTS

CN    1584703    2/2005

(Continued)

OTHER PUBLICATIONS

TW Preliminary Notice of First Office Action Dated Oct. 2, 2009, corresponding to U.S. Appl. No. 11/912,383.

(Continued)

*Primary Examiner* — Emily Le
*Assistant Examiner* — Lynne Edmondson
(74) *Attorney, Agent, or Firm* — H.C. Park & Associates, PLC

(57) ABSTRACT

The present invention relates to a thiogallate phosphor expressed as $AB_2S_4$. The thiogallate phosphor of the present invention is configured by replacing a position A where a divalent ion is required with a trivalent element having an ion size similar to that of the element at the position A and with a monovalent element having an ion size similar to that of the element at the position A. Preferably, the trivalent and monovalent elements are replaced by the same amount. Further, the present invention relates to a white light emitting diode and is to manufacture a white light emitting diode with excellent luminous efficiency.

15 Claims, 3 Drawing Sheets

U.S. PATENT DOCUMENTS

| | | | |
|---|---|---|---|
| 5,656,888 A | 8/1997 | Sun et al. | |
| 5,834,053 A | 11/1998 | Dye et al. | |
| 6,180,073 B1 * | 1/2001 | Huguenin et al. | 423/155 |
| 6,252,254 B1 | 6/2001 | Soules et al. | |
| 6,417,019 B1 | 7/2002 | Mueller et al. | |
| 6,501,102 B2 | 12/2002 | Mueller-Mach et al. | |
| 6,521,915 B2 | 2/2003 | Odaki et al. | |
| 6,617,782 B2 | 9/2003 | Cheong et al. | |
| 6,680,569 B2 | 1/2004 | Mueller-Mach et al. | |
| 6,686,691 B1 | 2/2004 | Mueller et al. | |
| 6,695,982 B2 | 2/2004 | Ellens et al. | |
| 6,762,551 B2 | 7/2004 | Shiiki et al. | |
| 6,773,629 B2 * | 8/2004 | Le Mercier et al. | 252/301.4 S |
| 6,783,700 B2 | 8/2004 | Tian et al. | |
| 6,809,347 B2 | 10/2004 | Tasch et al. | |
| 6,943,380 B2 | 9/2005 | Ota et al. | |
| 7,011,896 B2 * | 3/2006 | Yano et al. | 428/690 |
| 7,026,755 B2 | 4/2006 | Setlur et al. | |
| 7,229,573 B2 | 6/2007 | Setlur et al. | |
| 7,276,183 B2 | 10/2007 | Tian et al. | |
| 7,427,366 B2 | 9/2008 | Tian et al. | |
| 7,468,147 B2 | 12/2008 | Shida et al. | |
| 7,482,636 B2 | 1/2009 | Murayama et al. | |
| 7,608,200 B2 | 10/2009 | Seto et al. | |
| 7,959,321 B2 * | 6/2011 | Ryu et al. | 362/231 |
| 7,998,365 B2 * | 8/2011 | Kim et al. | 252/301.4 S |
| 8,088,302 B2 * | 1/2012 | Kim et al. | 252/301.4 S |
| 8,132,952 B2 * | 3/2012 | Ryu et al. | 362/606 |
| 2003/0020101 A1 | 1/2003 | Bogner et al. | |
| 2003/0076669 A1 | 4/2003 | Itoh et al. | |
| 2003/0228412 A1 | 12/2003 | Chen | |
| 2004/0051111 A1 | 3/2004 | Ota et al. | |
| 2004/0104391 A1 | 6/2004 | Maeda et al. | |
| 2004/0124758 A1 | 7/2004 | Danielson et al. | |
| 2004/0233664 A1 | 11/2004 | Beeson et al. | |
| 2005/0046334 A1 | 3/2005 | Fujiwara | |
| 2005/0082574 A1 | 4/2005 | Tasch et al. | |
| 2005/0123243 A1 | 6/2005 | Steckl et al. | |
| 2005/0135118 A1 | 6/2005 | Takata | |
| 2005/0140272 A1 | 6/2005 | Shirata | |
| 2005/0162069 A1 | 7/2005 | Ota et al. | |
| 2005/0211992 A1 | 9/2005 | Nomura et al. | |
| 2005/0224828 A1 | 10/2005 | Oon et al. | |
| 2005/0236958 A1 | 10/2005 | Wang et al. | |
| 2005/0254258 A1 | 11/2005 | Lee | |
| 2005/0276074 A1 | 12/2005 | Ryu | |
| 2006/0027788 A1 * | 2/2006 | Stiles et al. | 252/301.4 S |
| 2006/0081862 A1 | 4/2006 | Chua et al. | |
| 2006/0082296 A1 | 4/2006 | Chua et al. | |
| 2006/0203468 A1 | 9/2006 | Beeson et al. | |
| 2007/0075306 A1 | 4/2007 | Hayashi et al. | |
| 2007/0090381 A1 | 4/2007 | Otsuka et al. | |
| 2007/0221938 A1 | 9/2007 | Radkov et al. | |
| 2007/0259206 A1 | 11/2007 | Oshio | |
| 2008/0084150 A1 | 4/2008 | Cok | |
| 2008/0212305 A1 | 9/2008 | Kawana et al. | |
| 2009/0066230 A1 | 3/2009 | Hirosaki et al. | |
| 2009/0218581 A1 | 9/2009 | Schmidt et al. | |
| 2009/0295272 A1 | 12/2009 | Oshio | |

FOREIGN PATENT DOCUMENTS

| | | |
|---|---|---|
| DE | 10028266 | 12/2001 |
| JP | 53-061964 | 6/1978 |
| JP | 57-128772 | 8/1982 |
| JP | 2927279 | 5/1999 |
| JP | 2000-171796 | 6/2000 |
| JP | 2002-531956 | 6/2000 |
| JP | 2002-060747 | 2/2002 |
| JP | 2002-088359 | 3/2002 |
| JP | 2002-156531 | 5/2002 |
| JP | 2003-203504 | 7/2003 |
| JP | 2003-315796 | 11/2003 |
| JP | 2004-505172 | 2/2004 |
| JP | 2004-094031 | 3/2004 |
| JP | 2004-119375 | 4/2004 |
| JP | 2004-119743 | 4/2004 |
| JP | 2004-161807 | 6/2004 |
| JP | 2004-527638 | 9/2004 |
| JP | 2004-296830 | 10/2004 |
| JP | 2004-327492 | 11/2004 |
| JP | 2005-019997 | 1/2005 |
| JP | 2005-079500 | 3/2005 |
| JP | 2005-530349 | 10/2005 |
| JP | 2005-350649 | 12/2005 |
| JP | 2005-354027 | 12/2005 |
| JP | 2009-507935 | 2/2009 |
| KR | 10-2001-0089508 | 10/2001 |
| KR | 10-2001-0097147 | 11/2001 |
| KR | 10-2001-0101761 | 11/2001 |
| KR | 10-2002-0027538 | 4/2002 |
| KR | 10-2002-0067818 | 8/2002 |
| KR | 10-2004-0000004 | 1/2004 |
| KR | 10-2004-0088418 | 10/2004 |
| KR | 1020040086604 | 10/2004 |
| KR | 10-2005-0117165 | 12/2005 |
| KR | 10-2006-0028844 | 4/2006 |
| KR | 10-2006-0028932 | 4/2006 |
| KR | 10-2006-0063586 | 6/2006 |
| KR | 10-0601200 | 7/2006 |
| KR | 10-2007-0002385 | 1/2007 |
| KR | 10-0700231 | 3/2007 |
| TW | 563261 | 11/2003 |
| WO | 98/05078 | 2/1998 |
| WO | 00/33390 | 6/2000 |
| WO | 01/24229 | 4/2001 |
| WO | 02-11173 | 2/2002 |
| WO | 02-097901 | 12/2002 |
| WO | 02/098180 | 12/2002 |
| WO | 03/021691 | 3/2003 |
| WO | 03/080763 | 10/2003 |
| WO | 03/081957 | 10/2003 |
| WO | 03-107441 | 12/2003 |
| WO | 2004-007636 | 1/2004 |
| WO | 2005-026285 | 3/2005 |
| WO | 2005/068584 | 7/2005 |
| WO | 2006-126817 | 11/2006 |

OTHER PUBLICATIONS

Communication with Supplementary European Search Report dated Aug. 4, 2010, corresponding to U.S. Appl. No. 11/912,383.

International Search Report of PCT/KR2006/001921 dated Aug. 31, 2006, corresponding to U.S. Appl. No. 11/912,383.

Non-Final Office Action of U.S. Appl. No. 11/912,383 issued on Jun. 29, 2010.

Non-Final Office Action of U.S. Appl. No. 11/912,383 issued on Nov. 10, 2010.

Chinese Office Action dated Aug. 29, 2008, corresponding to U.S. Appl. No. 11/909,700.

International Search Report of PCT/KR2006/000885 dated on Jun. 21, 2006, corresponding to U.S. Appl. No. 11/909,700.

Written Opinion of PCT/KR2006/000885 dated on Jun. 21, 2006, corresponding to U.S. Appl. No. 11/909,700.

Non-Final Office Action of U.S. Appl. No. 11/909,700 issued on Jun. 3, 2010.

Notice of Allowance of U.S. Appl. No. 11/909,700 issued on Nov. 30, 2010.

Notice of Allowance of U.S. Appl. No. 11/912,383 issued on Feb. 23, 2011.

Non-Final Office Action of U.S. Appl. No. 12/904,219 issued on Mar. 3, 2011.

Non-Final Office Action of U.S. Appl. No. 11/912,383 issued on Mar. 29, 2011.

Philippot et al, "Relation between properties and structural evolution of some Si, Ge, Sn ternary chalogenides", React. Solids 8th Meeting, 1976, pp. 535-539.

Extended European Search Report dated Feb. 16, 2009.

European Search Report of EP Application No. 11 15 1900.5 issued on Apr. 26, 2011.

Chinese Office Action dated Feb. 5, 2010 in Chinese Patent App. No. 200680018490.1, corresponding to U.S. Appl. No. 11/912,384.

International Search Report of PCT/KR2006/001923 dated on Aug. 31, 2006, corresponding to U.S. Appl. No. 11/912,384.

Non-Final Office Action of U.S. Appl. No. 11/912,384 issued on Sep. 9, 2010.
Final Office Action of U.S. Appl. No. 11/948,813 issued on Dec. 8, 2010.
Non-Final Office Action of U.S. Appl. No. 11/948,813 issued on Aug. 18, 2010.
Non-Final Office Action of U.S. Appl. No. 12/306,664 issued on Feb. 1, 2011.
European Search Report of EP06768577.6 issued on Jan. 20, 2011, corresponding to U.S. Appl. No. 11/912,384.
Notice of Allowance of U.S. Appl. No. 11/912,384 issued on Feb. 2, 2011.
Baur et al. "White Light Emitting Diodes", (1998), Adv. Solid State Phys., vol. 67, pp. 67-78, corresponding to U.S. Appl. No. 11/913,538.
International Search Report of PCT/KR2006/002330 dated on Oct. 9, 2006, corresponding to U.S. Appl. No. 11/913,538.
Non-Final Office Action of U.S. Appl. No. 11/913,538 issued on Nov. 25, 2008.
Final Office Action of U.S. Appl. No. 11/913,538 issued on Apr. 17, 2009.
Non-Final Office Action of U.S. Appl. No. 11/913,538 issued on Jul. 31, 2009.
Final Office Action of U.S. Appl. No. 11/913,538 issued on Mar. 25, 2010.
Notice of Allowance of U.S. Appl. No. 11/913,538 issued on Jul. 23, 2010.
Final Office Action of U.S. Appl. No. 12/904,219 issued on Sep. 2, 2011.
European Search Report dated Apr. 26, 2011 for EP Application No. 11151900.5.
Notice of Allowance dated Sep. 9, 2011, issued for related co-pending U.S. Appl. No. 11/912,383.
Priliminary Notice of First Office Action of Taiwanese Patent Application No. 095109597 dated Apr. 17, 2012.
International Search Report of PCT/KR2006/003950 dated Dec. 28, 2006.
Non-Final Office Action of U.S. Appl. No. 12/088,624 dated Oct. 6, 2010.
Non-Final Office Action of U.S. Appl. No. 12/088,624 dated Apr. 7, 2011.
Non-Final Office Action of U.S. Appl. No. 12/088,624 dated Oct. 13, 2011.
Non-Final Office Action of U.S. Appl. No. 12/088,624 dated Mar. 14, 2012.

* cited by examiner

FLUORESCENT MATERIAL AND LIGHT EMITTING DIODE USING THE SAME

CROSS REFERENCE RELATED APPLICATION

This application is the National Stage of International Application No. PCT/KR2006/000961, filed Mar. 16, 2006, which is hereby incorporated by reference for all purposes as if fully set forth herein.

BACKGROUND OF THE INVENTION

1. Field of the Invention

The present invention relates to a phosphor and a light emitting diode using the same, and more particularly, a light emitting diode composed of a phosphor which has an excitation and emission characteristic for absorbing light emitted from a light emitting diode (LED) chip and emitting light suitable to realize white light.

2. Discussion of the Background

In general, a white light emitting diode is a light emitting device which is PN junction diode composed of a compound semiconductor and receives an voltage to emit light, so that a single chip or multiple chips may be used to realize white light.

When multiple chips are used to realize white light, the respective light emitting diodes are used as red, green and blue light emitting sources, and thus, the color rendering is very good. However, there are some problems in that it is not easy to mix colors due to the brightness difference of red, green and blue colors, the operating voltages applied to respective chips are uneven, and the outputs of respective chips are changed depending on the ambient temperature to cause the color coordinate to be changed.

On the other hand, when a single chip is used, a LED chip composed of compound semiconductor and a phosphor are combined to realize white light. To this end, on a blue light emitting LED chip, a phosphor using a portion of the blue light as an excitation source to emit yellow-green or yellow light is attached such that the blue light emitted from the LED chip and the yellow-green or yellow light emitted from the phosphor are mixed into the white light. Currently, an yttrium-aluminum-garnet based phosphor disclosed in Japanese Patent No. 2,927,279 or a combination of green and red phosphors for use in color televisions has been practically used as a phosphor.

That is, a white light emitting diode is obtained from a combination of a blue LED chip composed of a GaN semiconductor component within a wavelength range of 430 nm to 480 nm and a phosphor capable of emitting yellow light using the blue light as an excitation source. In general, this white light emitting diode so configured is widely employed since it is inexpensive and very simple in view of its principle and structure.

An yttrium-aluminum-garnet (YAG:Ce) based phosphor having typically excellent excitation capability by blue light, an orthosilicate phosphor having a chemical formula represented by $Sr_2SiO_4$:Eu and a thiogallate phosphor represented by $CaGa_2S_4$:Eu have been generally used as a phosphor for use in the white light emitting diode.

However, in order to synthesize the yttrium-aluminum-garnet based phosphor and the orthosilicate phosphor, there are problems in that high-temperature heat treatment conditions, very sophisticated purity control and exact stoichiometry are required. Further, in order to use the light emitting diode as a general lamp, a phosphor with higher luminous efficiency and intensity is required. Currently, studies for solving the aforementioned problems to develop a more economic synthetic method and for developing a phosphor with which the yttrium-aluminum-garnet phosphor and the orthosilicate phosphor can be replaced have been actively conducted throughout the world.

The thiogallate phosphor used to overcome the aforementioned problems is expressed as a general formula $AB_2S_4$:Eu, wherein A is at least one element selected from the group consisting of Ca, Sr and Ba, and B is at least one element selected from the group consisting of Al, Ga and In. More specifically, the $SrGa_2S_4$:Eu and $CaGa_2S_4$:Eu phosphors emit relatively intense green and yellow light, respectively.

The thiogallate phosphor has the same advantage as the yttrium-aluminum-garnet phosphor and the orthosilicate phosphor in that a variety of light emitting colors can be implemented by controlling the kinds and concentrations of elements in a base material and luminescence center (activator).

U.S. Pat. No. 3,639,254 as the prior art related to the thiogallate phosphor discloses a thiogallate phosphor and a manufacturing method thereof in which Eu, Pb and Ce are used as luminescence center (activator). In this patent, a number of embodiments with various composition providing a wide range of light emitting colors depending on the kinds and concentrations of the luminescence center (activator) are described. Further, U.S. Pat. No. 5,834,053 discloses a blue light emitting thiogallate phosphor with a crystalline microstructure and a method for manufacturing the phosphor using a chemical vapor deposition (CVD). Specifically, the method for manufacturing an electroluminescent device with a thin film layered structure by providing a low-temperature process, in which the conventional high-temperature annealing step is eliminated, such that a general glass panel can be used on behalf of a special panel made of a glass-ceramic material.

The above U.S. Pat. Nos. 3,639,254 and 5,834,053 disclose the thiogallate phosphors whose emission spectra exist within a blue or green spectrum range. These phosphors are expressed as $AGa_2S_4$, wherein A is at least one element selected from the group consisting of alkali earth metal specifically including Ca, Ba, Sr and Zn. The luminescence center (activator) is Eu, Pb or Ce.

However, the luminous efficiency of the above phosphor is very low as compared with application fields (e.g., the illumination engineering) in which light with higher luminous efficiency is required.

As another prior art, U.S. Pat. No. 6,695,982 discloses a thiogallate phosphor with high luminous efficiency and a manufacturing method thereof in order to solve the problems related to the low luminous efficiency. In this patent, the ratio of the divalent ions A to the trivalent ions B in the thiogallate phosphor with the general formula $AB_2S_4$ is selected to differ from the ratio A:B=1:2. Therefore, higher luminous efficiency can be obtained and different light emitting wavelength and color positions can be accomplished.

However, U.S. Pat. No. 6,695,982 merely discloses that a position A is replaced with an ion such as Zn or Mg ion with an ion size significantly smaller than Ca ion whereas a position B is replaced with another ion such as Y ion with an ion size significantly larger than Ga ion only in consideration of charge balance. This inconsistency of ion sizes may cause the crystal to be twisted and distorted, and thus, the luminescent characteristic will be greatly deteriorated.

SUMMARY OF THE INVENTION

The present invention is conceived to solve the aforementioned problem in the prior art. Accordingly, an object of the present invention is to synthesize a novel thiogallate phosphor with a superior fluorescent characteristic to the orthosilicate phosphor, the yttrium-aluminum-garnet phosphor or the conventional thiogallate phosphor through a precise ion exchange method to thereby manufacture a light emitting diode with excellent luminous efficiency and intensity by using the novel thiogallate phosphor.

According to an aspect of the present invention for achieving the object, there is provided a thiogallate phosphor expressed as $AB_2S_4$, wherein a divalent element at a position A is replaced with a trivalent element having an ion size similar to that of the divalent element at the position A and with a monovalent element having an ion size similar to that of the divalent element at the position A. Preferably, the trivalent and monovalent elements are replaced with the divalent element by the same amount as each other.

According to another aspect of the present invention, there is provided a phosphor having the following chemical formula (1):

$$(A_{1-x-y}Eu_x(M^I_{0.5}M^{III}_{0.5})_y)B_2S_4, \quad (1)$$

wherein A is at least one element selected from the group consisting of Ba, Sr and Ca; B is at least one element selected from the group consisting of Al, Ga and In; $M^I$ is at least one element selected from the group consisting of Li, Na and K; and $M^{III}$ is at least one element selected from the group consisting of Sc, Y, Lu, Gd and La; and $x+y \leq 1$.

In the chemical formula (1), $0.005 \leq x \leq 0.9$ and $0 \leq y \leq 0.995$.

Preferably, the chemical formula (1) can be expressed as the chemical formula (2):

$$(Ca_{1-x-y}Eu_x(M^I_{0.5}M^{III}_{0.5})_y)Ga_2S_4. \quad (2)$$

Further, the chemical formula (2) may be expressed as any one of the chemical formulas (3) to (6):

$$(Ca_{1-x-y}Eu_x(Y_{0.5}Li_{0.5})_y)Ga_2S_4; \quad (3)$$

$$(Ca_{1-x-y}Eu_x(Sc_{0.5}Li_{0.5})_y)Ga_2S_4; \quad (4)$$

$$(Ca_{1-x-y}Eu_x(Sc_{0.5}Na_{0.5})_y)Ga_2S_4; \text{ and} \quad (5)$$

$$(Ca_{1-x-y}Eu_x(Y_{0.5}Na_{0.5})_y)Ga_2S_4. \quad (6)$$

In addition, the chemical formula (3) may be expressed as the chemical formula (7) and the chemical formula (4) may be expressed as the chemical formula (8):

$$(Ca_{0.36}Y_{0.3}Li_{0.3})Ga_2S_4:Eu_{0.04}; \text{ and} \quad (7)$$

$$(Ca_{0.36}Sc_{0.3}Li_{0.3})Ga_2S_4:Eu_{0.04} \quad (8)$$

According to a further aspect of the present invention, there is provided a light emitting diode comprising a LED chip and the aforementioned phosphor with excitation and emission characteristic that is absorbing light from the LED chip and emitting light suitable to implement white light. Preferably, the LED chip has a peak wavelength of 420 nm to 480 nm.

BRIEF DESCRIPTION OF THE DRAWINGS

The above and other objects, features and advantages of the present invention will become apparent from the following description of a preferred embodiment given in conjunction with the accompanying drawings, in which.

DETAILED DESCRIPTION OF THE ILLUSTRATED EMBODIMENTS

Figure 1:
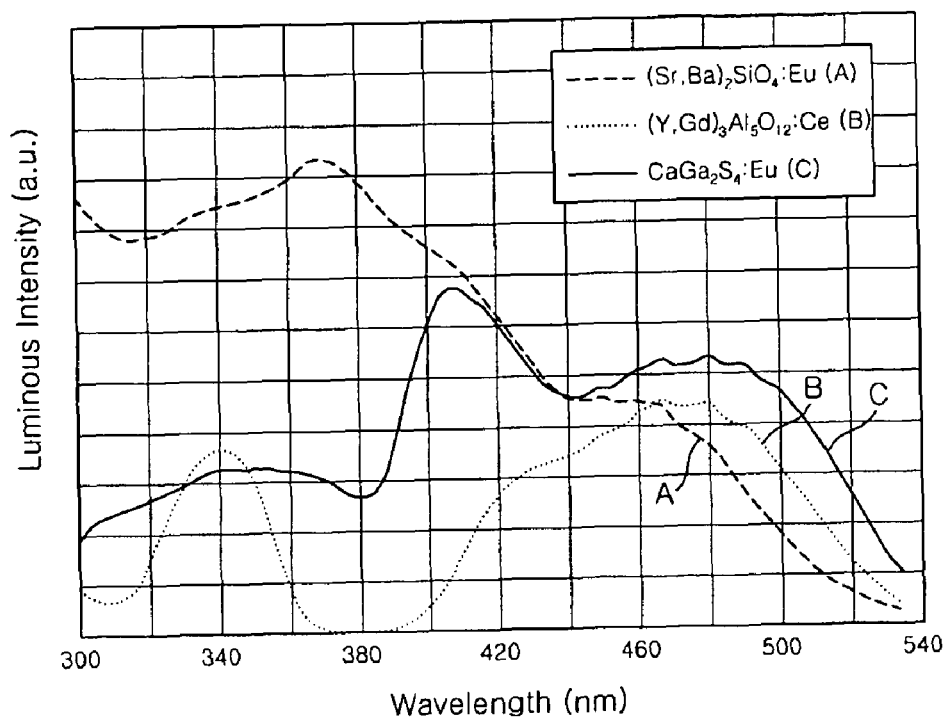
FIG. 1 is excitation spectra of $(Sr,Ba)_2SiO_4:Eu$, $(Y,Gd)_3Al_5O_{12}:Ce$ and $CaGa_2S_4:Eu$ phosphors.

Hereinafter, a preferred embodiment of the present invention will be described in detail with reference to the accompanying drawings. However, the present invention is not be limited to the embodiment to be described below but may be implemented in various different forms. The embodiment is provided only to complete the disclosure of the present invention and fully conveys the scope of the present invention to those skilled in the art. Through the drawings, like elements are designated by reference numerals.

A phosphor is composed of a host lattice and an active ion doped with an impurity at a predetermined position, and the active ion serves to determine an energy level related to a light emitting process to thereby determine a light emitting color. The light emitting color is determined by an energy gap between the ground state of the active ion and the excitation state thereof in the lattice structure. That is, the main light emitting color of the phosphor having the active ion is ultimately determined by an electronic state of the active ions, i.e. the energy level. For example, in case of $Tb^{3+}$ ion, a transition from 5d to 7f is most probable in the host lattice, thereby resulting in a yellow-green light emitting phenomenon.

There are various kinds of phosphors using such energy gaps, and light emitting diodes with various light emitting colors, specifically a white light emitting diode, can be manufactured by using the various phosphors.

If a light emitting device with a wavelength of 400 nm to 500 nm is used as an excitation source, the yttrium-aluminum-garnet phosphor can be used to manufacture the white light emitting diode with an improved characteristic. Further, the orthosilicate phosphor represented by $Sr_2SiO_4:Eu$ can use light ranging from UV light to visible blue light as an excitation source, and the orthosilicate phosphor has an advantage in that a position of an element Sr can be replaced with an element Ba to synthesize a green phosphor whereas the position of the element Sr can be replaced with an element Ca to synthesize a yellow phosphor.

Further, the conventional thiogallate phosphor having a general formula of $AB_2S_4$ has advantages in that its fluorescent characteristic is excellent and a position of an element A can be replaced with Ba, Sr or Ca and a position of an element B can be replaced with Al, Ga or In to synthesize the blue to red light emitting phosphors depending on suitable composition ratios, in the same manner as the orthosilicate phosphor. More specifically, the light emitting color of the phosphor can be determined by the kinds and concentrations of the luminescence center (activator) such as Eu as well as the kinds and concentrations of the base material.

The $Eu^{2+}$ luminescence is implemented through the transition from a $4f^65d^1$ excited state to a $4f^7$ ground state, wherein the position of the $4f^65d^1$ excited state for determining the light emitting color depends on the ambient environment and the crystal field around the Eu ion in the base material. The yellow luminescence that is relatively important in the LED market is implemented from the CaGa₂S₄:Eu composition. Further, if the light emitting device with a wavelength range of 380 nm to 500 nm from UV light to visible blue light is used as an excitation source, the white light emitting diode with an excellent characteristic can be realized.

Figure 2:
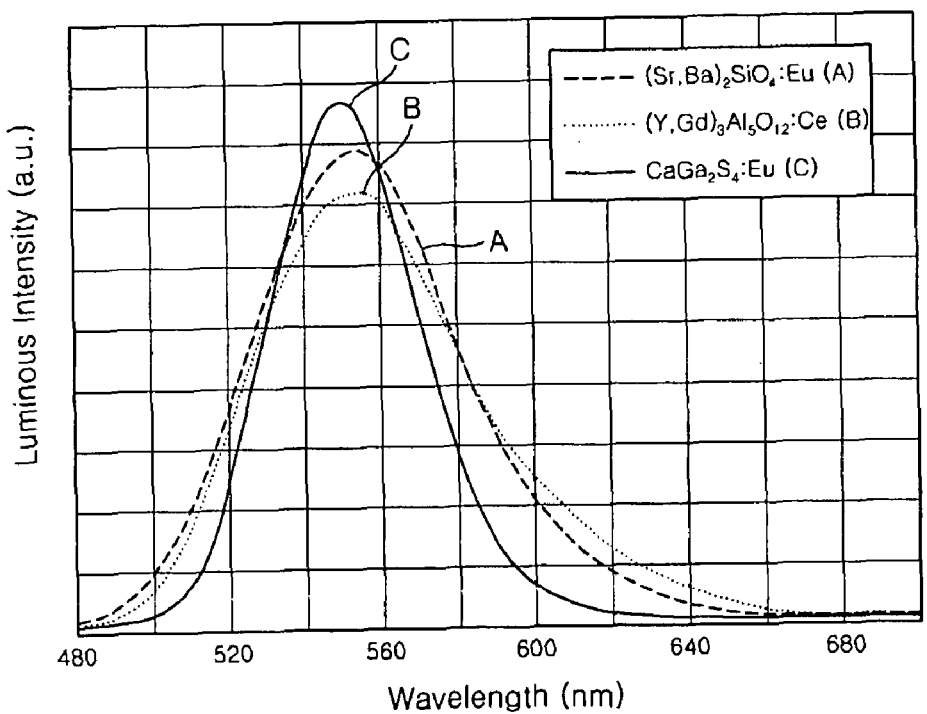
FIG. 2 is emission spectra of $(Sr,Ba)_2SiO_4:Eu$, $(Y,Gd)_3Al_5O_{12}:Ce$ and $CaGa_2S_4:Eu$ phosphors excited by light with a wavelength of 460 nm.

Referring to FIGS. 1 and 2, a curve A represents an orthosilicate phosphor expressed as $(Sr,Ba)_2SiO_4$:Eu, a curve B represents an yttrium-aluminum-garnet phosphor expressed as $(Y,Gd)_3Al_5O_{12}$:Ce, and a curve C represents a thiogallate phosphor expressed as $CaGa_2S_4$:Eu.

FIG. 1 shows excitation spectra of $(Sr,Ba)_2SiO_4$:Eu, $(Y,Gd)_3Al_5O_{12}$:Ce and $CaGa_2S_4$:Eu phosphors. That is, the excitation spectra of the orthosilicate phosphor, the yttrium-aluminum-garnet phosphor and the thiogallate phosphor are compared with one another. It is noted that the $CaGa_2S_4$:Eu phosphor also has an excellent excitation characteristic in a blue excitation range (between 420 nm and 470 nm) similar to the $(Sr,Ba)_2SiO_4$:Eu and $(Y,Gd)_3Al_5O_{12}$:Ce phosphors.

FIG. 2 shows emission spectra of $(Sr,Ba)_2SiO_4$:Eu, $(Y,Gd)_3Al_5O_{12}$:Ce and $CaGa_2S_4$:Eu phosphors excited by light with a wavelength of 460 nm. It is noted that the energy excited by blue light with a wavelength of 460 nm is converted into yellow emission, and that all the orthosilicate phosphor, the yttrium-aluminum-garnet phosphor and the thiogallate phosphor represent the high emission characteristic. Specifically, it can also be noted that the thiogallate phosphor has much higher luminous intensity than those of the other two phosphors.

Unlike the conventional thiogallate phosphor in which both the light emitting color and the luminous intensity have been greatly changed by replacing positions A and B denoted in the general formula of the conventional thiogallate based phosphor with Sr and Ba elements and Al and In elements, respectively, the new ion exchange and ion exchange method according to the present invention exhibits excellent luminous intensity while maintaining the light emitting color as it is.

The technical feature of the present invention is directed to a method for synthesizing a phosphor with an excellent luminescent characteristic by first replacing a position A where a divalent ion is required with a trivalent ion having a similar ion size and then replacing the position A with a monovalent ion having a similar ion size by the same amount as the trivalent ion to compensate the exchange, so that the total charge balance can be maintained at the position A where the divalent ion is required.

That is, the ion exchange of the present invention has been made in consideration of the electronegativity, the charge balance and the ion size. Some prior art patents for the thiogallate phosphor disclose that the position A is replaced with an ion such as Zn or Mg ion having an ion size significantly smaller than Ca ion while the position B is replaced with another ion such as Y ion having an ion size significantly larger than Ga ion merely in consideration of the charge balance. However, this inconsistency of ion sizes may cause crystals to be twisted and distorted, and thus, the luminescent characteristic can be abruptly reduced. The reason is that the ion such as Zn or Mg ion is too small to form the coordination number of 8 at the position A while it is difficult for the oversized ion such as Y ion to form the coordination number of 4 at the position B.

Accordingly, the phosphor of the present invention has such a structure as expressed by the following chemical formula (1):

$(A_{1-x-y}Eu_x(M^I_{0.5}M^{III}_{0.5})_y)B_2S_4$ (1)

wherein A is at least one element selected from the group consisting of Ba, Sr and Ca, and B is at least one element selected from the group consisting of Al, Ga and In. Further, in the chemical formula (1), $M^I$ is at least one element selected from the group consisting of Li, Na and K, and $M^{III}$ is at least one element selected from the group consisting of Sc, Y, Lu, Gd and La, wherein $M^I$ and $M^{III}$ are simultaneously replaced by the same amount. That is, in the conventional thiogallate phosphor expressed as the general formula $AB_2S_4$, the position A where a divalent ion is required is first replaced with the trivalent $M^{III}$ having a similar ion size and the position A is then replaced with the monovalent $M^I$ having a similar ion size by the same amount as that of the trivalent $M^{III}$ to compensate the exchange, such that the total charge balance condition can be maintained at the position where the divalent ion is required. Therefore, a phosphor with an excellent luminescent characteristic can be synthesized.

As a result, since this dual exchange was made in consideration of the ion exchange between the ions with the same ion size as each other, the charge balance can be maintained to be identical to that of the conventional thiogallate phosphor without causing the crystal lattice to be deformed. Accordingly, a phosphor with excellent luminous efficiency and intensity can be synthesized while maintaining the total change balance.

Further, in the above chemical formula (1), range of x and y is $0.005 \leq x \leq 0.9$ and $0 \leq y \leq 0.995$. Preferably, range of x and y is $0.01 \leq x \leq 0.1$ and $0.2 \leq y \leq 0.8$.

The chemical formula (1) can be expressed as the following chemical formula (2):

$(Ca_{1-x-y}Eu_x(M^I_{0.5}M^{III}_{0.5})_y)Ga_2S_4$ (2)

That is, the A and B in the chemical formula (1) are substituted with Ca and Ga elements, respectively.

In the chemical formula (2), $M^I$ is at least one element selected from the group consisting of Li, Na and K, and $M^{III}$ is at least one element selected from the group consisting of Sc, Y, Lu, Gd and La. Therefore, the chemical formula (2) can be expressed as the following chemical formulas (3) to (6):

$(Ca_{1-x-y}Eu_x(Y_{0.5}Li_{0.5})_y)Ga_2S_4$ (3);

$(Ca_{1-x-y}Eu_x(Sc_{0.5}Li_{0.5})_y)Ga_2S_4$ (4);

$(Ca_{1-x-y}Eu_x(Sc_{0.5}Na_{0.5})_y)Ga_2S_4$ (5); and

$(Ca_{1-x-y}Eu_x(Y_{0.5}Na_{0.5})_y)Ga_2S_4$ (6)

Assuming that the y of $M^I$ and $M^{III}$ is 0.6 and the concentration of Eu as the luminescence center (activator) is 0.04 in the chemical formulas (3) and (4), the phosphors of the present invention can be expressed as the following chemical formulas (7) and (8), respectively:

$(Ca_{0.36}Y_{0.3}Li_{0.3})Ga_2S_4:Eu_{0.04}$ (7); and

$(Ca_{0.36}Sc_{0.3}Li_{0.3})Ga_2S_4:Eu_{0.04}$ (8)

In order to synthesize the phosphor, Eu oxides, Eu sulfides, Sc oxides, Ni oxides, Y oxides, rare earth oxides, Ga oxides, Ga sulfides, Li carbonates or the like is used. Raw materials are mixed in harmony with a desired composition ratio, and the mixed raw materials are then heat treated at a temperature range of 800° C. to 1000° C. under the gas atmosphere including $H_2S$. If necessary, the phosphor subjected to the primary heat treatment is milled and remixed and the remixed phosphor is then subjected to the secondary heat treatment in order to improve the desired characteristic.

Figure 3:
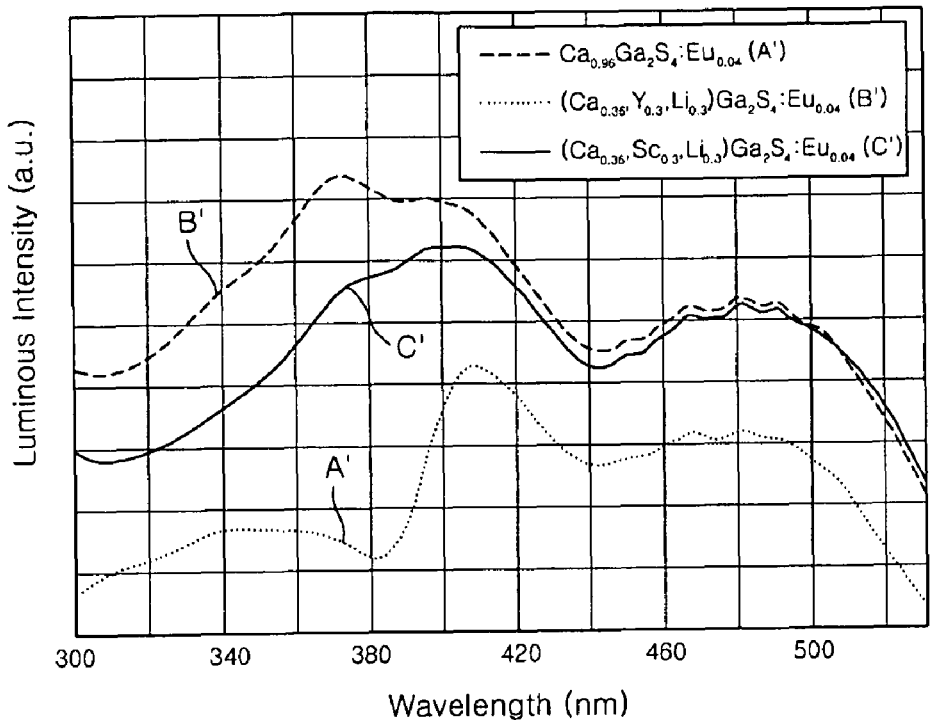
FIG. 3 is excitation spectra of the conventional $CaGa_2S_4:Eu$ thiogallate phosphor and $(Ca_{0.36}Y_{0.3}Li_{0.3})Ga_2S_4:Eu_{0.04}$ and $(Ca_{0.36}Sc_{0.3}Li_{0.3})Ga_2S_4:Eu_{0.04}$ phosphors according to the present invention.
Figure 4:
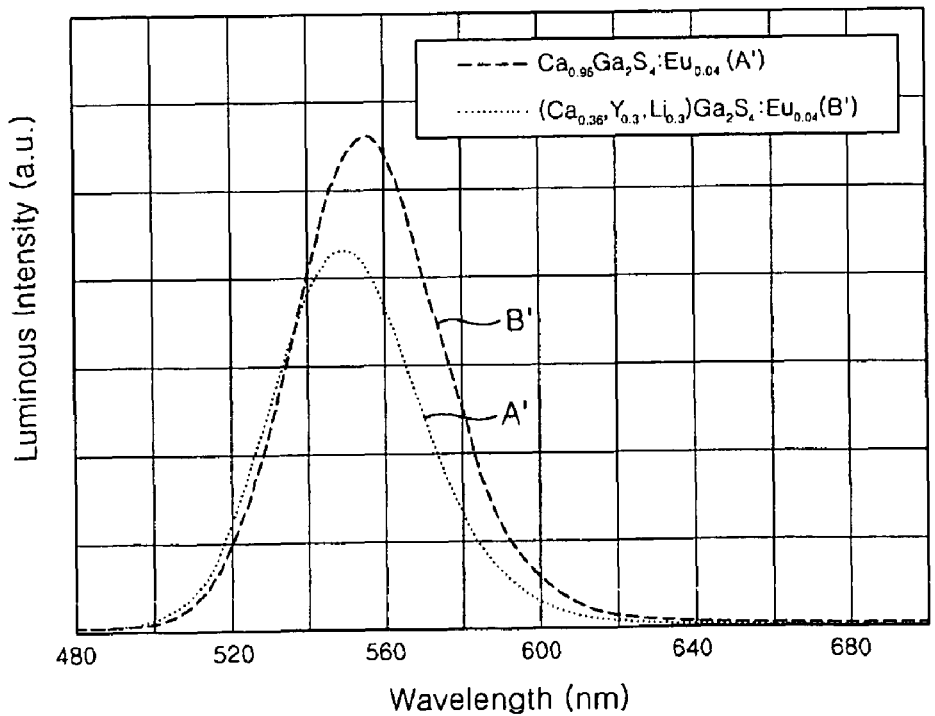
FIG. 4 is emission spectra of the conventional $CaGa_2S_4:Eu$ thiogallate phosphor and the $(Ca_{0.36}Y_{0.3}Li_{0.3})Ga_2S_4:Eu_{0.04}$ phosphor according the present invention.

Hereinafter, FIGS. 3 and 4 show comparison results of the excitation and emission spectra of the conventional thiogallate phosphor A' and the novel thiogallate phosphor B' and C' according to the present invention. In the figures, A' is the conventional thiogallate phosphor expressed as CaGa$_2$S$_4$:Eu, B' is (Ca$_{0.36}$Y$_{0.3}$Li$_{0.3}$)Ga$_2$S$_4$:Eu$_{0.04}$ according to the present invention, and C' is (Ca$_{0.36}$Sc$_{0.3}$Li$_{0.3}$)Ga$_2$S$_4$:Eu$_{0.04}$ according to the present invention.

FIG. 3 shows the excitation spectra of the conventional CaGa$_2$S$_4$:Eu thiogallate phosphor and the (Ca$_{0.36}$Y$_{0.3}$Li$_{0.3}$)Ga$_2$S$_4$:Eu$_{0.04}$ and (Ca$_{0.36}$Sc$_{0.3}$Li$_{0.3}$)Ga$_2$S$_4$:Eu$_{0.04}$ phosphors according to the present invention. Since the phosphors according to the present invention have much more superior excitation characteristic to the convention thiogallate phosphor in a range from UV to blue light, they can be used as an excellent light source for manufacturing a white light emitting diode employing the UV light as well as a white light emitting diode employing the blue light.

FIG. 4 shows the emission spectra of the conventional CaGa$_2$S$_4$:Eu thiogallate phosphor and the (Ca$_{0.36}$Y$_{0.3}$Li$_{0.3}$)Ga$_2$S$_4$:Eu$_{0.04}$ phosphor according to the present invention. It can be understood that as compared with the conventional thiogallate phosphor such as CaGa$_2$S$_4$:Eu, (Ca$_{0.36}$Y$_{0.3}$Li$_{0.3}$)Ga$_2$S$_4$:Eu$_{0.04}$ exhibits the higher emission characteristic through the excitation by light with a wavelength of 460 nm.

Hereinafter, a light emitting diode including the phosphor as described above will be described.

The light emitting diode is manufactured by mounting a LED chip onto a printed circuit board in which an electrode for receiving an electrical signal is formed, coating the phosphor on the LED chip and then forming a molding portion for sealing the LED chip. On the LED chip for emitting blue light is coated with the phosphor which is expressed as the chemical formula (1) of (A$_{1-x-y}$Eu$_x$(M$^I_{0.5}$M$^{III}_{0.5}$)$_y$)B$_2$S$_4$ and uses a portion of the blue light as an excitation source to emit yellow-green or yellow light, such that the white light can be obtained by the blue light emitted from the LED chip and the yellow-green or yellow light emitted from the phosphor. That is, the white light emitting diode is composed of a combination of the blue LED chip with a peak wavelength range of 420 nm to 480 nm and the phosphor capable of generating yellow light using the blue light as an excitation source.

Figure 5:
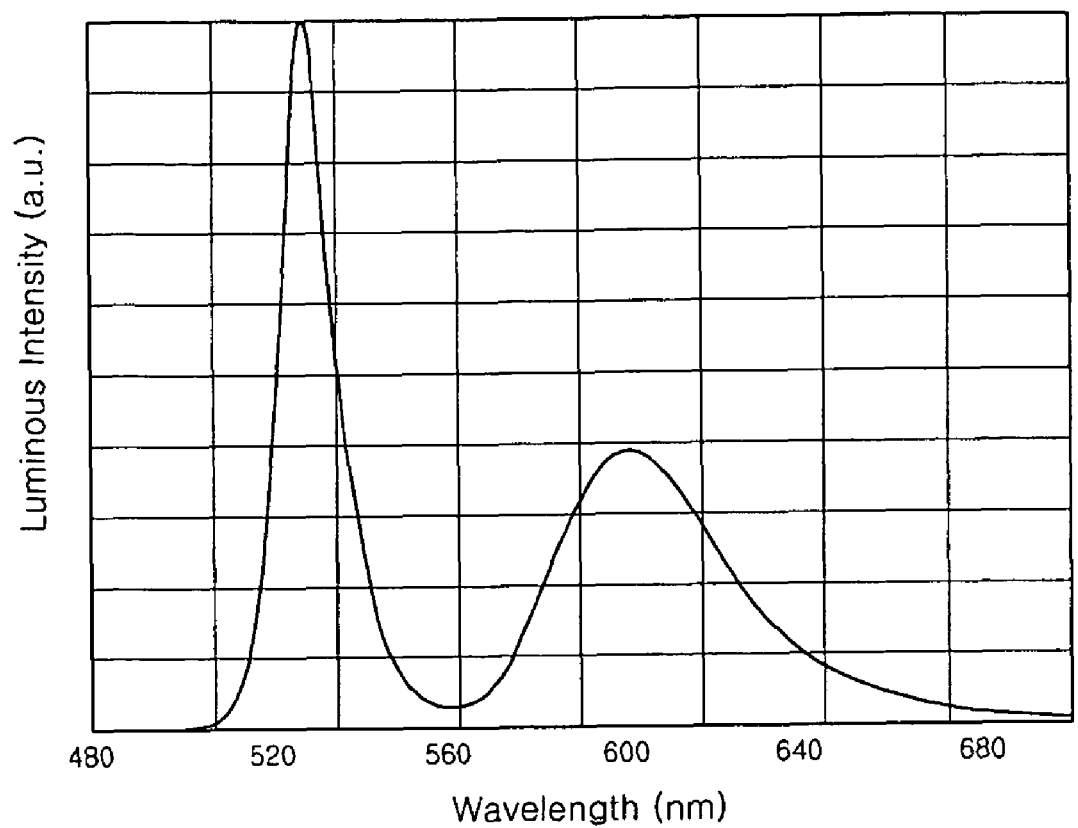
FIG. 5 is emission spectra of a white light emitting diode manufactured by using the blue light emitting diode and the $(Ca_{0.36}Y_{0.3}Li_{0.3})Ga_2S_4:Eu_{0.04}$ phosphor.

FIG. 5 shows the emission spectrum of the light emitting diode according to the present invention. That is, the spectrum is an emission spectrum of a white light emitting diode manufactured by using the blue LED chip and the (Ca$_{0.36}$Y$_{0.3}$Li$_{0.3}$)Ga$_2$S$_4$:Eu$_{0.04}$. The white light emitting diode exhibits the excellent luminous intensity.

The light emitting diode including the phosphor according to the present invention so configured causes the luminous intensity to be increased such that the increased luminous intensity can enhance the brightness of a liquid crystal display with the light emitting diode for backlighting in order to ensure a much brighter screen and thus to save the energy. Furthermore, because of the improved characteristics that is higher luminous efficiency and intensity, it can be applied to an electric sign board, an emergency board, and a general lamp for use in decoration, road, store, home, factory, etc. as well as the backlight of the cellular phone, LCD and television set. Further, the light emitting diode with the improved luminous intensity may be replaced with a fluorescent lamp when it is used as a general lamp. It is believed that the present invention contributes to the improvements in the luminescent characteristic and luminous flux of the light emitting diode, which will be used in the general lamp for home, store, factory, etc. by submitting for a conventional fluorescent lamp in the near future.

As describe above, a novel composition obtained by the ion exchange method in accordance with the present invention can be used to manufacture the white light emitting diode and to further improve the luminous efficiency of the light emitting diode.

Further, the phosphor of the present invention has a significantly excellent excitation characteristic than the conventional thiogallate phosphor over the range from the UV light to blue light. Therefore, the phosphor can be used as an excellent light source when manufacturing the white light emitting diode employing the UV light as well as the white light emitting diode employing the blue light.

Furthermore, since the light emitting diode of the present invention can increase luminous intensity as compared with the conventional light emitting diode, there is an advantage in that the light emitting diode of the present invention can be applied to a variety of applications.

The invention claimed is:

1. A phosphor expressed as AB$_2$S$_4$:Eu, wherein a divalent element at a position A is replaced with a trivalent element and with a monovalent element, wherein the phosphor comprises the chemical formula:

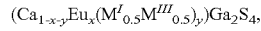
(Ca$_{1-x-y}$Eu$_x$(M$^I_{0.5}$M$^{III}_{0.5}$)$_y$)Ga$_2$S$_4$, wherein M$^I$ is at least one element selected from the group consisting of Li, Na and K; and M$^{III}$ is at least one element selected from the group consisting of Sc, Y, Lu, Gd and La; x>0; and x+y≦1.

2. The phosphor as claimed in claim 1, wherein the trivalent and monovalent elements replace the divalent element in equal amounts.

3. A phosphor having the chemical formula:

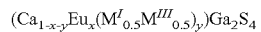
(Ca$_{1-x-y}$Eu$_x$(M$^I_{0.5}$M$^{III}_{0.5}$)$_y$)Ga$_2$S$_4$ wherein M$^I$ is at least one element selected from the group consisting of Li, Na and K; and M$^{III}$ is at least one element selected from the group consisting of Sc, Y, Lu, Gd and La; x>0; and x+y≦1.

4. The phosphor as claimed in claim 3, wherein 0.005≦x≦0.9 and 0≦y≦0.995.

5. The phosphor as claimed in claim 3, wherein the chemical formula can be expressed as any one of the chemical formulas (3) to (6):

(Ca$_{1-x-y}$Eu$_x$(Y$_{0.5}$Li$_{0.5}$)$_y$)Ga$_2$S$_4$;  (3)

(Ca$_{1-x-y}$Eu$_x$(Sc$_{0.5}$Li$_{0.5}$)$_y$)Ga$_2$S$_4$;  (4)

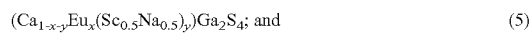
(Ca$_{1-x-y}$Eu$_x$(Sc$_{0.5}$Na$_{0.5}$)$_y$)Ga$_2$S$_4$; and  (5)

(Ca$_{1-x-y}$Eu$_x$(Y$_{0.5}$Na$_{0.5}$)$_y$)Ga$_2$S$_4$  (6).

6. The phosphor as claimed in claim 5, wherein the chemical formula (3) can be expressed as the chemical formula (7) and the chemical formula (4) can be expressed as the chemical formula (8):

(Ca$_{0.36}$Y$_{0.3}$Li$_{0.3}$)Ga$_2$S$_4$:Eu$_{0.04}$; and  (7)

(Ca$_{0.36}$Sc$_{0.3}$Li$_{0.3}$)Ga$_2$S$_4$:Eu$_{0.04}$  (8).

7. A light emitting diode, comprising:
a LED chip; and
a phosphor expressed as AB$_2$S$_4$:Eu, wherein a divalent element at a position A is replaced with a trivalent element and with a monovalent element, wherein the phosphor comprises the chemical formula:

$$(Ca_{1-x-y}Eu_x(M^I{}_{0.5}M^{III}{}_{0.5})_y)Ga_2S_4,$$

wherein $M^I$ is at least one element selected from the group consisting of Li, Na and K; and $M^{III}$ is at least one element selected from the group consisting of Sc, Y, Lu, Gd and La; x>0; and x+y≦1.

8. The light emitting diode as claimed in claim 7, wherein the LED chip has a peak wavelength of 420 nm to 480 nm.

9. The phosphor as claimed in claim 1, wherein the divalent element, the trivalent element, and the monovalent element have similar ion sizes such that the crystal lattice structure of the phosphor is not deformed.

10. The phosphor as claimed in claim 1, wherein 0.005≦x≦0.9 and 0≦y≦0.995.

11. The phosphor as claimed in claim 1, wherein the chemical formula (2) can be expressed as any one of the chemical formulas (3) to (6):

$$(Ca_{1-x-y}Eu_x(Y_{0.5}Li_{0.5})_y)Ga_2S_4; \quad (3)$$

$$(Ca_{1-x-y}Eu_x(Sc_{0.5}Li_{0.5})_y)Ga_2S_4; \quad (4)$$

$$(Ca_{1-x-y}Eu_x(Sc_{0.5}Na_{0.5})_y)Ga_2S_4; \text{ and} \quad (5)$$

$$(Ca_{1-x-y}Eu_x(Y_{0.5}Na_{0.5})_y)Ga_2S_4 \quad (6).$$

12. The phosphor as claimed in claim 11, wherein the chemical formula (3) can be expressed as the chemical formula (7) and the chemical formula (4) can be expressed as the chemical formula (8):

$$(Ca_{0.36}Y_{0.3}Li_{0.3})Ga_2S_4:Eu_{0.04}; \text{ and} \quad (7)$$

$$(Ca_{0.36}Sc_{0.3}Li_{0.3})Ga_2S_4:Eu_{0.04} \quad (8).$$

13. The phosphor as claimed in claim 7, wherein 0.005≦x≦0.9 and 0≦y≦0.995.

14. The phosphor as claimed in claim 7, wherein the chemical formula can be expressed as any one of the chemical formulas (3) to (6):

$$(Ca_{1-x-y}Eu_x(Y_{0.5}Li_{0.5})_y)Ga_2S_4; \quad (3)$$

$$(Ca_{1-x-y}Eu_x(Sc_{0.5}Li_{0.5})_y)Ga_2S_4; \quad (4)$$

$$(Ca_{1-x-y}Eu_x(Sc_{0.5}Na_{0.5})_y)Ga_2S_4; \text{ and} \quad (5)$$

$$(Ca_{1-x-y}Eu_x(Y_{0.5}Na_{0.5})_y)Ga_2S_4 \quad (6).$$

15. The phosphor as claimed in claim 14, wherein the chemical formula (3) can be expressed as the chemical formula (7) and the chemical formula (4) can be expressed as the chemical formula (8):

$$(Ca_{0.36}Y_{0.3}Li_{0.3})Ga_2S_4:Eu_{0.04}; \text{ and} \quad (7)$$

$$(Ca_{0.36}Sc_{0.3}Li_{0.3})Ga_2S_4:Eu_{0.04} \quad (8).$$

\* \* \* \* \*